United States Patent [19]

Chang

[11] 4,003,037

[45] Jan. 11, 1977

[54] MAGNETIC BUBBLE DOMAIN PROCESSING APPARATUS AND METHOD

[75] Inventor: Hsu Chang, Yorktown Heights, N.Y.

[73] Assignee: International Business Machines (IBM), Armonk, N.Y.

[22] Filed: Apr. 21, 1975

[21] Appl. No.: 570,326

[52] U.S. Cl. ............................. 340/174 TF
[51] Int. Cl.² ............................ G11C 11/14
[58] Field of Search ................. 340/174 TF

[56] References Cited
UNITED STATES PATENTS

| | | | |
|---|---|---|---|
| 3,765,004 | 10/1973 | Caron | 340/174 TF |
| 3,786,455 | 1/1974 | Grubb et al. | 340/174 TF |
| 3,812,480 | 5/1974 | Kish et al. | 340/174 TF |

*Primary Examiner*—James W. Moffitt
*Attorney, Agent, or Firm*—Pollock, Vande Sande & Priddy

[57] ABSTRACT

Bubble domain logic apparatus and a method of processing data in the form of a stream of magnetic bubble domains which represent data by their coding (such as presence and absence of bubble domains). The data stream has a key associated with each data entity. A bubble lock at a junction directs the associated data entity to one of two possible paths. In this fashion the key associated with the data determines the processing of the data in a self-programmed fashion.

The bubble lock accepts a stream of bubble domains which are taken to represent units consisting of key/data. A splitter duplicates the key and inserts the duplicated key in the stream so that the units in the stream represent key/key/data. An array of bubble domain switches are selectively located to correspond to a selected single key of all possible combinations. This array acts to compare the first key with the selected key and the remainder of the stream, representing key/data, is directed out on one of two possible paths depending on the relationship between the key and the selected key.

One of the output paths from the bubble lock may be connected to a logic circuit so the logic circuit receives the data entity if, and only if, the key leading the data entity matches the lock. The logic apparatus may or may not perform a logic operation on the key, as well as the data entity.

31 Claims, 4 Drawing Figures

MAGNETIC BUBBLE DOMAIN PROCESSING APPARATUS AND METHOD

FIELD OF THE INVENTION

This invention relates to bubble domain logic apparatus and a method of processing data in the form of magnetic bubble domains.

BACKGROUND OF THE INVENTION

One of the most significant factors in the ability of modern day computers to solve a seemingly limitless variety of problems is the generality of the device. It can be conceived as being comprised of a limited number of logic elements which can be selectively arranged in an almost infinite variety of combinations to act on the relevant data under the control of a program which can be varied to determine which particular problem the computer is to solve. The same sort of generality is desirable, even on the level of a group of or single logic circuit. Of course, on this level, some other method of control must be provided as it would be senseless to provide a program with its attendant storage, decoding and other requirements for each of the plurality of logic circuits.

There is a class of logic circuits, more particularly bubble domain logic circuits in which the advantages to be derived from the factor of generality have been appreciated and implemented. In my patent application Ser. No. 488,876, filed July 15, 1974 now abandoned and assigned to the assignee of this application, I disclose a bubble logic array which can be personalized under control of other logic apparatus in which one embodiment employs a control bubble stream to personalize the bubble logic. array.

A majority of the bubble devices which are disclosed in the prior art employ bubble domains as information carriers. A stream of bubbles (and voids) can be uniformly propagated. In a typical binary system, the presence of a bubble may be taken to represent a 1 while a void may be taken to represent a 0, (or vice versa). A stream of bubbles can therefore quite easily be conceived as a serial data stream. Furthermore, the mutual interaction of bubbles can be employed to advantage in synthesizing logical operations.

In addition to my patent application,, referred to above, a number of prior art patents disclose controlling a bubble domain stream by one or more resident bubbles. In this regard see U.S. Pat. Nos. 3,543,255, 3,638,208, 3,753,253 and 3,760,386.

Each of these patents, as well as my copending application, require a separate bubble domain propagation arrangement to provide the resident control bubble necessary for operation of these respective disclosures. In some applications, the separate bubble propagation and synthesizing apparatus provided may be duplicative of the propagating apparatus already present. Furthermore, this apparatus clearly requires the expenditure of power and may well introduce delays into the overall operation of the apparatus. The present invention obviates these drawbacks by providing a bubble propagation arrangement through which a plurality of data entities travel. The particular path of each data entity is determined by a key which travels along with the data entity. The key performs the same functions as does the control bubble or resident bubble in the aforementioned disclosures. However, by allowing the key to travel with the data entity no further bubble propagation and synthesizing apparatus is required. Furthermore, each data entity, since it carries its own key, may travel along a path which is different from the path on which a preceeding or subsequent data entity travels. Although a data entity may in fact represent a data word it may also be either shorter or longer than the typical data word length and thus the generic term data entity is employed.

By locating different logic circuits in different portions of a bubble domain propagation path the key, in controlling the path of a data entity likewise controls the logic operations which are performed thereon. In this fashion a self-programmed bubble domain logic apparatus is provided.

It is therefor a primary object of the present invention to provide a self-programmed bubble domain logic apparatus. It is another object of the present invention to provide a bubble domain logic apparatus in which a key associated with each data entity determines the logic operations which are to be performed on the associated data entity.

It is another object of the present invention to provide a bubble domain lock means which is capable of directing a stream of buble domains to take one of two possible propagation paths. It is another object of the present invention to provide such a bubble domain lock means which directs a stream of bubble domains to take a particular propagation path in dependence upon the relationship between a key, in the form of coded bubble combinations (such as bubbles-voids, or other bubble coding schemes) in the bubble domain stream, and an array of switches comprising said lock means.

SUMMARY OF THE INVENTION

The foregoing objects and advantages of the invention are achieved by the apparatus disclosed herein. A control means is disclosed for directing a data entity through one or another of a pair of propagation paths depending upon the state of a key associated with the data entity. The control means comprises a propagation means for propagating the key and data entity in serial order. Means are provided for duplicating the keys and propagating, at the output of said means for duplicating, in serial order key, key and data entity. Furthermore, means are connected to the means for duplicating to compare the key with a preselected key configuration allowing the following key and data entity only to propagate on one or another of the two paths.

A specific illustrative embodiment of the invention is disclosed in which data is represented by the presence and absence of single wall magnetic domains propagating in suitable propagating medium. Preferably, a rotating magnetic field provides for uniform propagation of the single wall domains. In the referred to embodiment the means for comparing may comprise switch means including loadable bubble domain switch means having a number of potential switch positions equal to the potential number of single wall domains in the key. For each position of the selected key which includes the absence of a single wall domain a loadable switch is provided. For those positions in the selected key which are represented by the presence of a single walled domain a trap is provided. The first key in the serial stream is propagated until each bubble domain position is opposite a potential switch position. A suitable control current loads each of the switches which are present with a bubble domain adjacent thereto (if any). If the key associated with the data entity corresponds to the selected key, none of the loadable switches will contain a single wall domain. Under these conditions the subsequent key and the data entity will be directed to the first output path of the switch means, i.e., the path which is used for a data entity associated with a key corresponding to the selected key. If any of the loadable switches contain a bubble domain, then, the following key and associated data entity will be directed to the second output path, i.e., that output path provided for a data entity which is associated with a key which does not match the selected key. Subsequent to passage of the key/data through the switch means the switch means is cleared of any bubble domains and is then ready for further operations.

In the foregoing fashion the path of each data entity is controlled by its associated key. The first output path may be connected to the input of a logic circuit so that data entities with keys corresponding to the selected key will be subjected to the logic operation. The second output path may be connected at the output path of the logic means so that a data entity and associated key is available at the output of the logic means regardless of whether or not the data entity and key have traversed the logic means. In one embodiment the keys themselves may be operated on by the logic apparatus.

If a key does not correspond to the selected key of a particular switching means the bubble domain stream representing key/data may be switched on to the non-preferred path. This switching operation occurs by reason of a bubble domain being loaded into a loadable switch comprising a permalloy structure to control the routing of the subsequent domain stream. In the case of a simple code in which a bubble domain represents 1 and the absence of a bubble domain represents 0 some means must be provided to prevent the possibility of a key consisting of the absence of a bubble domain in each key position. Such a key will, by reason of the switching action involved, pass any bubble domain switching means. Means can be readily arranged to prevent the use of a key consisting of the absence of bubble domains in each key position (i.e. an illegal key). However, if the logic apparatus, with which the bubble domain lock means is associated, operates on the key as well as on the data entity then it is entirely possible for a "legal" key to be modified by the logic means and produce the "illegal" key referred to above. Thus, in embodiments which the logic means operates on the key as well as on the data entity the simple code outlined above cannot be used.

For those embodiments, a code can be employed in which each bit of a key is represented by two bubble domain positions. For instance, the presence of a bubble domain followed by the absence of a bubble domain may represent a 1 and the opposite may represent a 0. Of course, in employing this key it is not the presence and/or absence of bubble domains which represent information but rather the order in which the bubble domains appear. Suitable switch means can be provided to operate with this type of code and, as a result, the logic apparatu may well operate on the key as well as on the data.

Although I have previously referred to use of a rotating magnetic field, or field access, other propagation apparatus, such as current access, may also be employed.

BRIEF DESCRIPTION OF THE DRAWINGS

The description of preferred embodiments of my invention, contained herein should be read in conjunction with the attached drawings attached hereto in which like reference numerals identify like apparatus, and, in which.

DETAILED DESCRIPTION OF THE PREFERRED EMBODIMENTS

Figure 1:
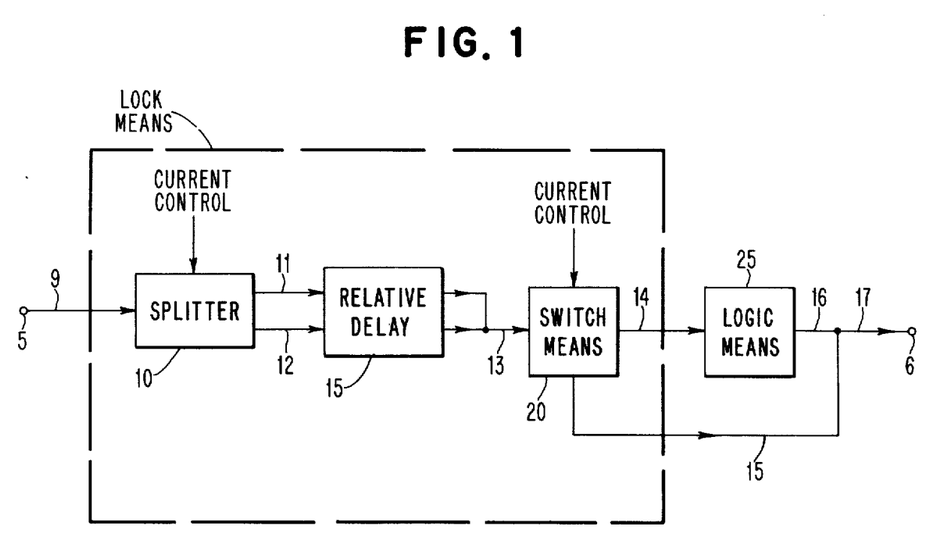
FIG. 1 is a block diagram, of the invention including lock means and logic means.

FIG. 1 is a schematic diagram representing apparatus employing my invention. In particular, a propagation path 9 is included between reference characters 5 and 6 for the propagation of signals which are representative of information. The apparatus of my invention is adapted to operate on a specific configuration of information representing, in serial order, a key followed by a data entity. If we assume the binary notation, which is convenient for purposes of explanation, the key may include a plurality of bit positions which are directly followed by the data entity which includes a second plurality of bit positions. Generally, although not necessarily exclusively, the data entity will contain a greater number of bit positions than the leading key. Serially connected to the propagation path 9 is a splitter 10 which has two outputs, propagation paths 11 and 12. The splitter is adapted to duplicate the key such that one of the two outputs, for instance 11, carries the original key/data entity whreas the output path 12 carries only the duplicated key. Connected to either or both output paths 11 and 12 is a relative delay unit 15 which is adapted to delay the original key and data entity such that at its outputs, the serial bubble stream appearing on propagation 13 will be representative of key/key/data entity by which notation I mean that the first group of signals will represent the original key, the second group of signals will represent an identical key and the third group of signals will represent the original data entity. Although this approach is preferred, any arrangement may be employed which results in a serial stream representing key/key/data entity.

Propagation path 13 forms an input to a switch means 20. The switch means 20 has two output paths, 14 and 15 respectively. The switch means 20 includes a plurality of potential switch positions equal in number to the number of bit postions in the key. A switch is only located at a potential switch position when the selected key is a 0 in that bit position. If the selected key has a 1 at any bit position, a switch is omitted. By selected key I mean the key which the switch means will allow to pass on the first or preferred path. Any other key will be directed, by the switch means out on the second, or non-preferred path. Since the key is represented in the binary system by a number of bits there are a number of potential switch positions of the switch means equal to the number of bits in the key. Therefore, for each 0 in the key there will be, in the associated bit position, a switch at that potential switch position. For each 1 in the selected key, there will be a switch in the potential switch position associated with that bit position. Depending upon the relationship between the selected key, which determines the configuration of the switch means, and the key actually fed into the switch means 20, the remaining portions of the serial signal stream will be outputed on either output line 14 or 15. In particular, if the key matches the selected key then the remaining portion of the serial stream, i.e. key/data entity will appear on output 14. On the other hand, however, if the key does not match the selected key then the remaining portion of the serial stream will appear on output path 15. Output path 14 is connected to the input of a logic means 25 whereas output path 15 is connected to the output of 16 of the logic means 25.

As a result, for each data entity which is associated with a key which matches the selected key for the switch means 20, that key and data entity will appear on output path 14 and traverse the logic means 25 and appear at the output 16. On the other hand, however, if the key associated with the data entity does not match the selected key then the following serial stream representing key/data entity will appear on output path 15 and will not traverse the logic means 25. Regardless of the relation between the key and the selected key, propagation path 17 will pass a serial stream representative of key/data entity. In the case where the key does not match the selected key, the serial stream will be identical in form to that originally propagated on propagation path 9. However, if the data entity entering on propagation path 9 were associated with a key which matched the selected key then the serial stream on propagation path 17 would comprise a modified key/data entity, in particular, the original key/data entity as modified by the logic means 25.

Of the apparatus illustrated in FIG. 1 the splitter 10, relative delay 15 and switch means 20 comprise the lock means. As is shown in FIG. 1 the lock means then controls access to the logic means 25. More particularly, for those data entities which are associated with a key which matches the selected key of the lock means, the lock means allows access to the logic means 25. On the other hand, all other data entities are shunted around the logic means. In any event, the output on propagation path 17 comprises key/data entity which may or may not be identical to the key/data entity appearing at the propagation path 9. In building up more comprehensive logical apparatus, the apparatus illustrated in FIG. 1 is duplicated many times and could, for instance, be serially connected so that a plurality of logic means is included in a single serial path and succeeding key/data entity units would be operated on by different ones of the logic means 25 depending upon the relationship between the key and the lock means associated with each of the different logic means. As is also well known to those skilled in the art the logic means may or may not include a second propagation path, if necessary, which may also be controlled in the manner illustrated in FIG. 1.

As has been mentioned above, in some embodiments it may not be desirable to allow the logic means to operate on the key portion of the information stream. This can be easily accomplished by disabling the logic means for the period of time during which the key portion is available to the logic means. On the other hand, in other embodiments it may be desirable to allow the logic means to operate on the key position of the information stream.

The remaining figures of the drawing illustrate a specific embodiment in which the block diagram of FIG. 1 is implemented to operate with information carries which are single wall magnetic domains propagating in a suitable medium by reason of, for example, the use of a rotating magnetic field cooperating with suitable magnetic patterns, such as T or I bars or chevrons, or the like. The magnetic patterns can be comprised of a material, such as NiFe, or can be ion-implanted regions of the magnetic bubble domain medium.

Figure 2:
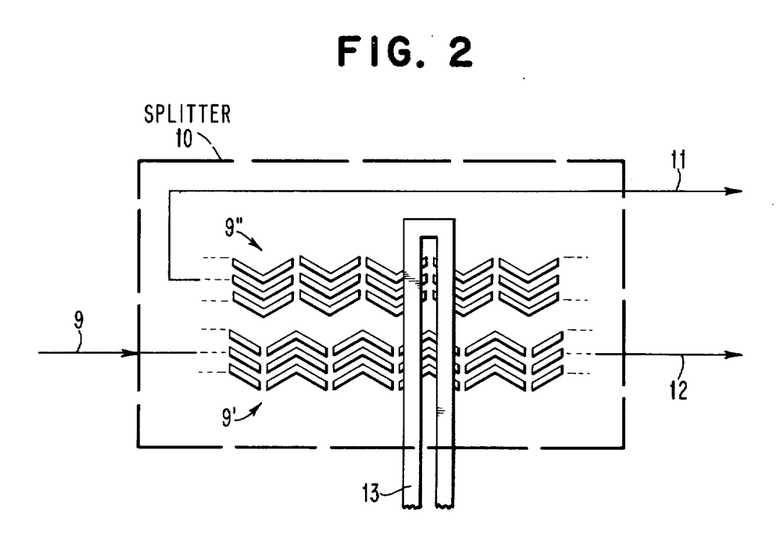
FIG. 2 is a detailed showing of a suitable splitter contained in FIG. 1.

The splitter 10, has the function of duplicating the key portion of the bubble domain stream. By operating the splitter 10 under the control of a control current, as indicated in FIG. 1, the apparatus is adapted to duplicate only the key portion of the bubble domain stream. That is, the key can be differentiated from the data entity on a timed basis. A suitable permalloy propagation pattern for the splitter 10 is illustrated in more detail in FIG. 2 employing the familar chevron pattern. The propagation path 9, which may take any of a variety of forms, is adapted to supply the bubble domain stream to one chevron propagation path 9', the other end of which is connected to the output path 12. A second chevron propagation path 9'', parallel to and displaced from the first chevron path 9' has one end thereof connected to another of the output paths 11. A control conductor 13 is operatively associated with both paths 9' and 9'' and is connected to the circuit control input terminal for the splitter 10. In operation, the bubble domain stream enters on the propagation path 9 and propagates to the right as illustrated in FIG. 2, until the first domain position (whether it contains a domain or a void) is adjacent the control conductor 13. A control current actuated at this time serves to stretch out and finally split off a duplicate domain in the path 9'' (if a domain is present in this position in path 9'). As the rotating magnetic field continues to rotate the original domain (or void) propagates along path 9' and exits along propagation path 12. The duplicated domain (if a domain were present in the original position) or void progresses along the path 9'' and exits along the output path 11. Similar operation is effected for each domain position in the key so that the key will exit on propagation path 12 and a duplicate of the key will exit on propagation path 11. By terminating the control current at the proper time the data entity, which follows the key, is not duplicated. The chevron pattern illustrated in FIG. 2 as well as the method of operation described above are contained in an article by Bobeck et al. entitled "Evolution of Bubble Circuits Processed by a Single Mask Level" appearing in the I.E.E.E. Transactions on Magnetics, Volume Mag-9 Number 3, September 1973, pages 474–480.

The output of the splitter 10 is provided through the relative delay unit 15 whose purpose is to bring together the bubble domain streams on the two propagation paths 11 and 12 so that the serial stream on propagation path 13 represents key/key/data entity. Preferably, a delay must be provided to the key/data entity appearing on path 12 and/or the key appearing on propagation path 11 must be speeded up relative to the former so that the key may be inserted adhead of the key/data entity appearing on propagation path 12. This can be effected by employing a conpressor inserted between propagation path 11 and 13. A suitable compressor is illustrated in the Morrow et al U.S. Pat. No. 3,543,255. Alternatively, or in addition thereto, the serial stream on propagation path 12 can be delayed relative to propagation path 11 by employing a serpentine or equivalent pattern in propagation path 12.

As a still further alternative those skilled in the art will understand that it is theoretically possible to insert the duplicated key (on propagation path 12) between the key and the data entity on propagation path 11. This requires delaying the duplicated key relative to the key and then delaying the data entity so that the duplicated key can be inserted between the key and data entity. For obvious reasons, however, this approach is not preferred.

Figure 3:
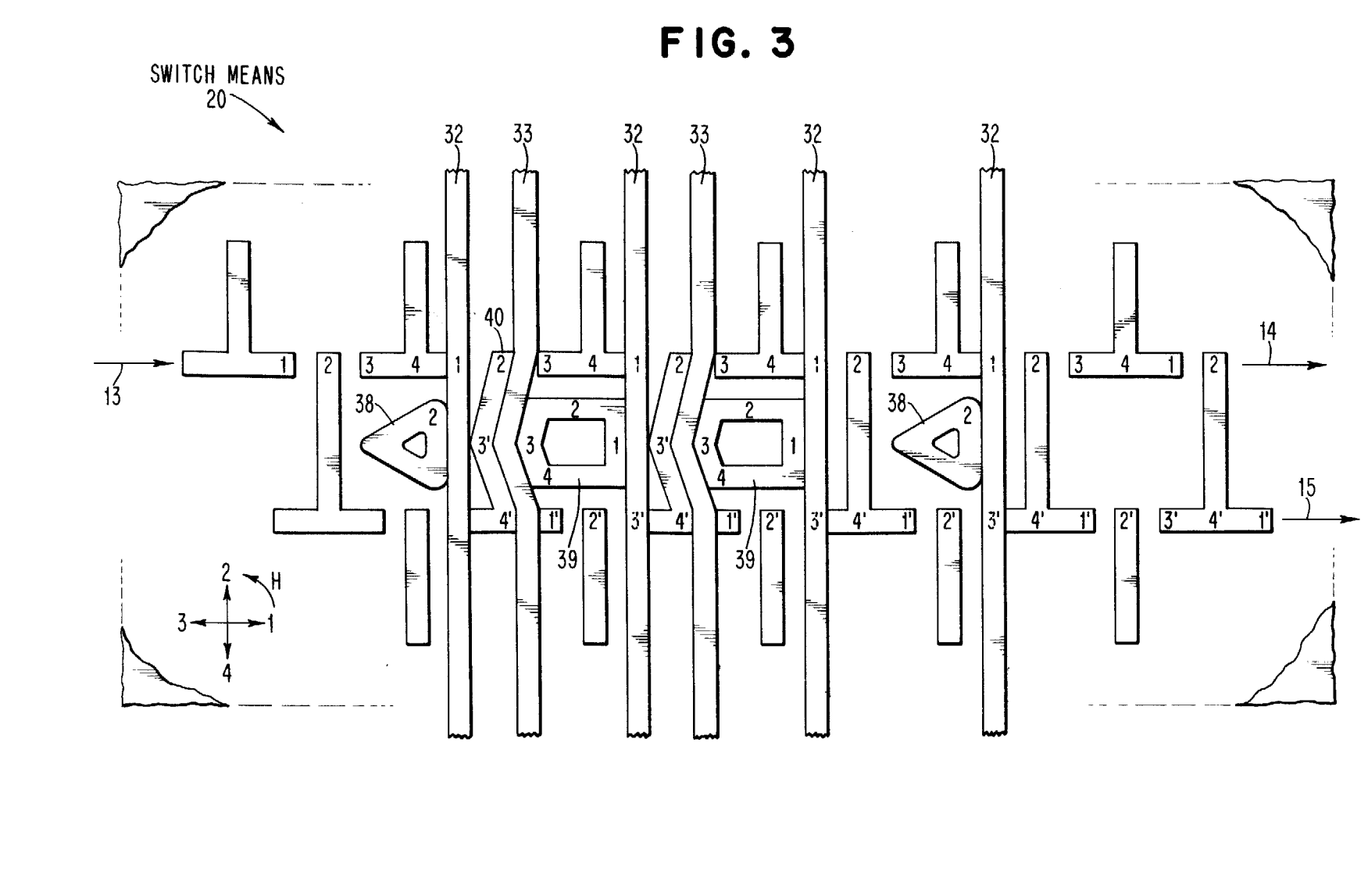
FIG. 3 is a detailed showing of suitable switches contained in FIG. 1.

FIG. 3 is a repesentation of a suitable pattern to perform the functions required by the switch means 20 (illustrated in FIG. 1). This particular pattern is based on the T and I bar propagation pattern which cooperates with a rotating magnetic field (represented by the phases 1-4) to cause bubble domains to propagate from left to right. For ease of correlating FIG. 3 with FIG. 1 propagation paths 13, 14 and 15 are identified by arrows in FIG. 3 which indicate the direction of propagation. As hereinafter referred to propagation path 14 is the preferred path, that is it is the path the bubble domain stream will take if the key associated with the data entity matches the selected key. Bubble domain streams with other keys will take the non-preferred path 15. In addition to the T and I bar pattern the switch means 20 in FIG. 3 includes bubble traps 38 as well as loadable bubble switches 39. It should be apparent from FIG. 3 a switch means 20 has been represented which is capable of operating with four bubble domains although the number of bubble domains can be enlarged by merely repeating the traps and switches, in an appropriate pattern. Both the traps 38 and switches 39 are in the form of patterns closed on themself which surround an inner area from which the permalloy material is absent. The traps are shaped and oriented (for example, as triangles) such that bubble domains trapped therein will not influence domains travelling frm propagation path 13 to propagation path 14. On the other hand, however, each switch 39 is shaped and oriented (for example pentagonal) with properly located apex so that a bubble domain resident in the switch 39 will cause another domain travelling on propagation path 13 to be shunted off to propagation path 15.

Switch means 20 includes a plurality of switches, such as switch 39 and traps such as trap 38. Each switch or trap is located at a potential switch position, such that the total number of switch positions equals the sum of traps and switches. The configuration of the switch means is determined by the number of switches therein, their position, the number of traps and their position. This is determined by the key which it is desired to pass the switch means on a preferred path. That key is hereafter called the selected key, and when a key matches the selected key, i.e., it is identical thereto, the associated key/data will pass the switch or trap on energization of the load conductor line.

Before explaining the manner in which the switch means 20 operates it will be useful to explain the manner in which the loadable switch 39 operates. In addition to the permalloy pattern, both the T and I bars, as well as the pentagonal loadable switch 39 itself, a pair of control conductors is provided. A first control conductor 32 operates to load the loadable switch 39 with a bubble domain if such domain is properly positioned adjacent to the loadable switch 39 at the time the conductor 32 is energized. At the conclusion of the operation, any bubble domains resident in the switch unit 39 must be cleared. A second control conductor 33 is energized to annihilate bubble domains previously resident in the loadable switch 39.

Let us assume a bubble domain is travelling, from left to right, entering from propagation path 13. The small numerals labeled on the T and I bar patterns identify the positions of such a bubble domain with respect to the different phases of the rotating magnetic field. During the transition from field phase 4 to phase 1, i.e., after phase 4 but before phase 1, the load control conductor 32 is energized. This makes pole 2 on switch 39 more favorable to the bubble than pole 2 on the next bent T-bar. Thus the bubble will be diverted from the propagation path 13-14 to the loadable switch 39. Once the bubble domain is located in the loadable switch 39 it will continue to circulate in the switch between locations 1-2-3-4-1, etc., synchronously with the different phases of the rotating magnetic field.

The traps are loaded in the same way as are the switches 39. That is, after a bubble domain is at pole position 4 of a T-bar along the propagation path 13, and before it gets to pole position 1 of the T-bar, a current flows in the control conductor 32 adjacent to that T-bar. This causes a transfer of the bubble from the T-bar to pole 2 of the adjacent bubble trap.

Assume now, that in addition to the bubble domain resident in the loadable switch 39, a second bubble domain enters at propagation path 13 and begins propagating toward preferred path 14. However, as the second bubble domain reaches bent T bar 40 at phase time 2 the bubble in the loadable switch 39 forces the second bubble domain to be diverted to follow path 3', 4' - 1',etc. instead of following these straight line path 2-3-4-1, etc.

At the conclusion of operation of the switching means 20, that is after each portion of the data entity has traversed the switching means 20, it is necessary to clear such loadable switch 39 of any bubble domains which may be resident therein. In order to effect this the clear lines 33 are energized at phase 3 of the rotating magnetic field. At that time the resident bubble domain will traverse the gap from 3 to 3' at phase time 3. When the bubble domain previously resident in the loadable switch 39 has been moved to location 4' the current in the clear line 33 is reversed to thereby collapse the bubble domain.

Thus, it should be apparent how the permalloy pattern, the pattern of the loadable switches 39 and the clear and load lines cooperate to transfer bubble domains from the preferred propagation path to the loadable switches, how the bubble domains resident in the loadable switch divert the following stream of bubble domains and how the bubble domain resident in the loadable switch 39 can be cleared and the loadable switch 39 readied for further operation.

In operation a serial stream representing key/key/data entity propagates into the switch means 20. Of course one of the two keys is a duplicate of the first and is provided by action of the splitter 10. Just after the first key has entered the switch means 20 and at a time when each key position is opposite each potential switch position the load conductor line is energized. This cases each bubble domain in the key to be loaded into the loadable switch 39 or trap 38 depending on the configuration of the switch means 20. At this time the switch means 20 is conditioned by the first key so as to properly control the following stream. In particular if the key matched the configuration of the switch means 20 no domain would be resident in a loadable switch 39. In such condition the remaining portion of the stream, representing key/data entity would traverse the switch means 20 and on the preferred path 14. However, if any one of the loadable switches 39 has a domain resident therein, that switch will divert the following stream to exit on the non-preferred path 15. Domains resident in the traps 38 have no effect on the following stream. After the following stream has traversed the switch means 20 any domain resident in a loadable switch 39 is ejected therefrom and annihilated by operation of the appropriate clear conductor 33 as explained previously.

The configuration of traps and loadable switches 39 illustrated in FIG. 3 dictates a selected key of bubble/no bubble/no bubble/bubble. However, any key in which the two middle positions are occuppied by voids will pass the switching means illustrated in FIG. 3. This is for the reason that the traps 38 are insensitive to the presence of a bubble or void and it is actually the loadable switches 39 which are effective to cause a trailing data entity to be diverted if the key position associated with the position in which the loadable switch lies, is occupied by a bubble. Discussion of the splitter 10 and relative delay unit 15 have made clear the manner in which the original pattern of key/data entity on propagation path 9 has been modified so that the pattern on propagation path 13 is now key/key/data. As the first key enters the switch means 20 the positions of the key advance synchronously until a key position is adjacent every potential switch position. At that time, the control conductor load lines are energized. Where traps 38 are present any bubble domain adjacent the trap will be transferred to the trap. Although the bubble domain is thereafter resident in the trap it will have no effect on the following bubble domains. The effect of a loadable switch 39 which is loaded with a bubble domain has been explained above, in detail. Of course, for those loadable switches 39 which have a void adjacent thereto at the time the load conductors are energized, no bubble domain is loaded. After the loading operation occurs the remaining portions of the bubble stream enter the switching means 20. If we assume that the key matched the selected key then every loadable switch 39 would have a void therein and would therefore have no effect on the propagation of the bubble stream which would exit on propagation path 14. However, if any one loadable switch 39 has a bubble domain resident therein the following bubble stream would be diverted by that bubble domain so that the following stream will exit on propagation path 15.

From the foregoing example it should be apparent that only the key positions which correspond to switch units 39 are effective in directing the path of the following key/data entity. The potential switch positions which contain traps are ineffective to control the propagation path. Since the traps are located at potential switch positions which correspond to a 1 of a selected key, it is only the positions in which the selected key contains a 0 that will have a loadable switch 39 and which will be effective to control the direction of propagation of a key/data entity. As a direct consequence of the foregoing, the key which is all 1's, and hence implemented by all traps will pass data indiscriminately, that is, it is not a key at all.

As has been discussed previously, this problem is alleviated by insuring that no key consists of all voids. For instance, at the system input the number of voids could be counted and, if that equaled the number of bit positions in the key, the key/data entity would be shunted out of the system. This is quite effective so long as the key that has passed the foregoing test remains unchanged throughout its travel through the logic system. However, if the logic unit 25 is capable of operating on the key then it is quite possible for the logic unit to transform a legal key into the illegal key which consists of all voids. With that in mind, then, the key code which the logic unit 25 operates on must be different than the simple binary code in which a bubble represents 1 and a void represents 0 (or vice-versa). That is, the new key code never includes a key having all voids, thus pre-emptying undesirable conversions.

One relatively simple code which can be employed uses two potential bubble positions for each bit. For instance, 1 can be represented by a bubble-void, in serial order, whereas 0 can be represented by a void-bubble, in serial oder (or vice-versa). Employing this code every key would have an identical number of bubbles with every other key, but it is the positions of the bubbles which are significant. Thus, the pattern illustrated in FIG. 3 would represent a key of 10, since the selected key would correspond to bubble-void (a 1) and a void-bubble (a 0).

Figure 4:
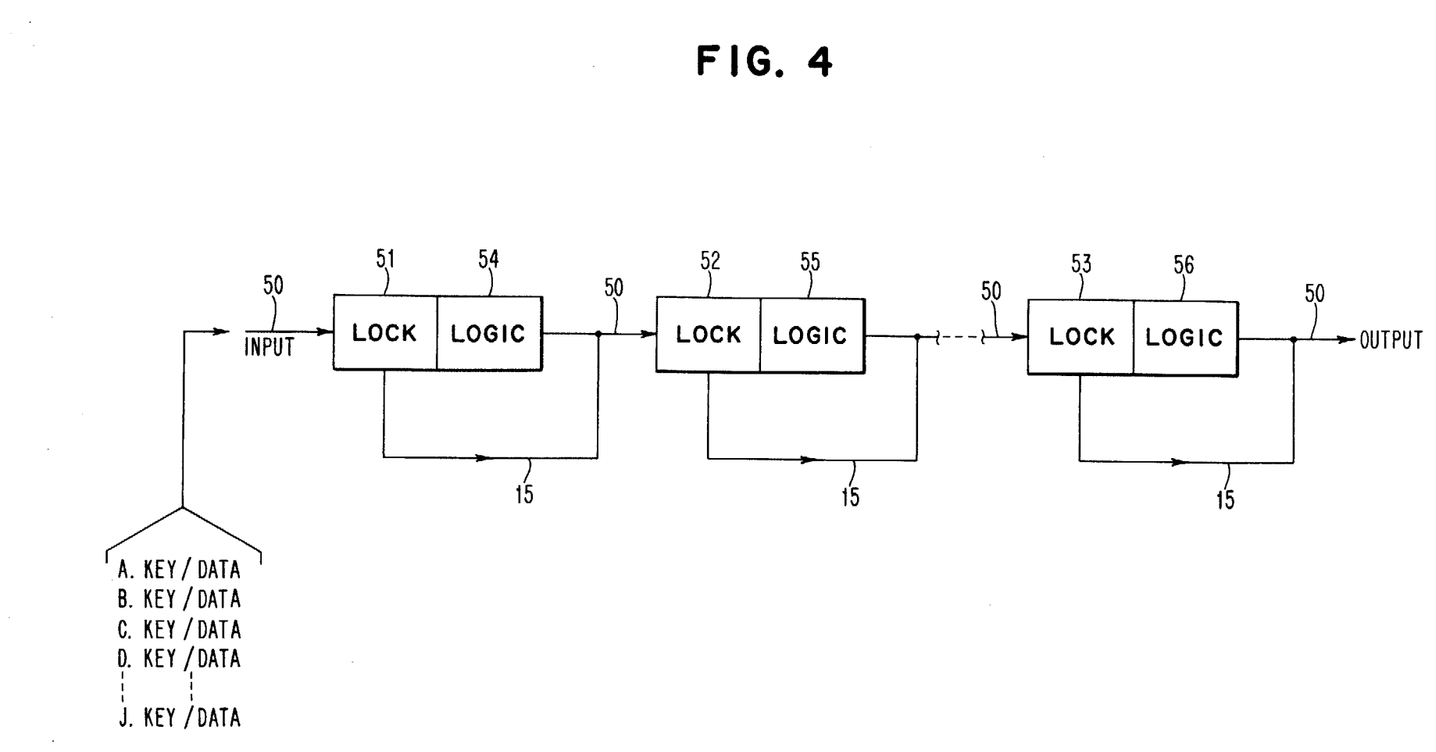
FIG. 4 is a block diagram representing an application of my invention.

FIG. 4 represents a typical application providing a self-programmed logical apparatus. In FIG. 4, a data propagation means 50 connects a plurality of groups of locks and logic apparatus in a serial combination between an input and an output. A serial signal stream is provided to the input over propagation means 50. For reference purposes we can consider the serial stream to consist of a number of different entities, illustrated in FIG. 4 as entities A through J. Each entity includes a key and a data entity. Each of the logic units included between the input and the output has associated therewith a lock, such as that shown in FIG. 1. Each lock operates in response to receipt of a key and compares that key with the selected key. The lock allows the associated logic unit to operate on the data associated with the key when and only when the key matches the selected key for which the lock has been configured. Therefore, for instance, if the statement A key matches lock 52, statement B key matches lock 53, statement C key matches lock 51 and statement D key matches none of these locks then the following operations will occur. The output stream will include the data associated in statement A as modified by the logic apparatus 55. Following those signals the output stream will include the data entity of statement B modified by logic apparatus 56, followed by the data entity in statement c modified by logic apparatus 54. In conclusion, the data entity specified in statement D will pass through the apparatus with no modification whatsoever. Of course, plural locks in a serial stream may be configured based on identical selected keys such that a particular data entity is operated by more than one logic apparatus. Those having skill in the art will understand that this arrangement provides self-programming in that the logical functions performed on any data entity are predetermined by the key which accompanies that data entity.

In the embodiments referred to above I have mentioned that each switch means includes a number of potential switch positions N equal to the potential number of bubbles in any key. Those of ordinary skill will understand, however, that a switch means with N potential switch positions is capable of operating with keys with less than N potential bubble positions. Stated the other way a key of N potential positions can cooperate with a switch means with a potential number of switch positions equal to or greater than N. In either case the potential switch positions in excess of the number of bubble positions in any key will "see" voids which will not affect operation of the lock.

Furthermore, although I have referred to a data entity it should be understood that a single data entity may include plural groups of data and the logic means may logically operate on one or more of the plural groups of data comprising the data entity.

What I claim is:

1. Control means for directing a data entity to one or another path depending on a key associated with said entity comprising., propagation means for propagating said key and data entity in serial order, means for duplicating said key and for propagating, in serial order a first key, a second key and said data entity, third means connected to said last named means and responsive to one of said keys for allowing said other key and said data entity only to propagate on said one path or said other path.

2. The apparatus of claim 1 in which said third means includes a plurality of switches responsive to distinctive components of said one key for controlling the propagation of said other key and said data entity.

3. The apparatus of claim 1 in which said propagation means comprises a bubble propagation means and in which said key and data entity are comprised of a pattern of magnetic bubbles.

4. The apparatus of claim 3 in which said third means comprise a plurality of loadable bubble switches and traps.

5. The apparatus of claim 4 in which said key is comprised of a number N of magnetic bubble positions and any key is comprised of a number of bubbles and voids whose sum is equal to N, the sum of the number of loadable switches and traps is equal to or greater than N.

6. The apparatus of claim 4 in which each of said loadable switches and traps has a current control means associated therewith to load magnetic bubble into said switches and traps.

7. The apparatus of claim 4 in which each of said loadable switches has a current control means to clear a resident magnetic bubble from said switches.

8. The apparatus of claim 4 in which each of said loadable switches and traps comprises a closed permalloy pattern enclosing a volume devoid of permalloy.

9. The apparatus of claim 8 in which each of said loadable switches is pentagonal and each of said traps is triangular.

10. The apparatus of claim 8 in which each of said loadable switches is pentagonal and located to deflect a magnetic bubble stream from said one path to said other path when a magnetic bubble is resident therein.

11. A bubble domain lock adapted to accept a stream of bubble domains representing, in serial order, a key and a data entity, connected to a first output path for allowing said stream to enter said first output path only if said key is of a predetermined pattern comprising, means for propagating said bubble domains, means for receiving said stream and for duplicating said key and providing an output stream of the form key/key/data, switch means with an input path for accepting said output stream and first and second output paths, said switch means responsive to one of said keys for directing a portion of said stream representing key/data to either said first output path if and only if said key comprises a predetermined pattern and for otherwise directing said portion of said stream to said second output path.

12. The apparatus of claim 11 in which said duplicating means includes a pair of bubble domain paths, one of said paths receiving said stream, bubble splitter means for splitting each bubble domain adjacent said splitter when energized and control means for, at times, energizing said splitter means or splitting any bubble domains representing said key, the output end of one of said paths propagating said stream and the output end of said other path propagating the duplicated portion of said stream.

13. The apparatus of claim 12 which includes delay means having a pair of input paths and a single output path, said pair of inputs connected to the output ends of said pair of paths of said duplicating means, said delay means combining a magnetic bubble stream on each of said paths to provide a stream on said single output representing key/key/data.

14. The apparatus of claim 13 in which said delay means delays the stream representing key/data by the time required to propagate the stream representing a key.

15. The apparatus of claim 11 wherein said switch means is responsive to distinctive components of one of said keys for controlling on which of said first and second output paths a stream representative of key/data is propagated.

16. The apparatus of claim 15 in which said switch means includes at least one loadable switch and means to load components of said first key into said at least one loadable switch.

17. The apparatus of claim 16 in which said means to load includes a current energized control means.

18. The apparatus of claim 16 in which each said at least one loadable switch means includes a permalloy closed pattern of magnetic material enclosing a space lacking said material adjacent said first and second output paths for switching said stream onto said second path when a magnetic bubble is resident in said switch means.

19. The apparatus of claim 18 in which said loadable switch means pattern is pentagonal.

20. A self-programmed logic apparatus including a plurality of logic means interconnected by a signal propagation medium, each of said logic means having an input and an output and performing a logical operation on signals presented at said input and producing an output, coupled to said signal propagation medium, a plurality of lock means each with an input and output, each of said logic means associated with a different one of said lock means, said logic means input connected to one of said lock means output, said lock means input connected to said signal propagation medium, said lock means allowing signals to reach the associated logic means if and only if said signals are preceeded by a predetermined signal combination.

21. The apparatus of claim 20 in which each of said logic means are serially interconnected by said signal propagation medium.

22. The apparatus of claim 20 in which each said lock means has a second output providing said signals if said signals are not proceeded by said predetermined signal combination.

23. The apparatus of claim 22 in which each said second lock means output is connected to said signal propagation medium.

24. The apparatus of claim 22 in which each said second lock means output is connected to the junction of said associated logic means output and said signal propagation medium.

25. The apparatus of claim 20 in which said signal propagation medium comprises a bubble propagation means, said logic means comprise means for performing logic operations on magnetic bubbles and said signals are streams of magnetic bubbles and voids.

26. The apparatus of claim 25 in which each said lock means has a second output providing said signals not proceeded by said predetermined signal combination.

27. The apparatus of claim 26 in which each said lock means second output is connected to said signal propagation medium.

28. The apparatus of claim 25 in which each said lock means comprises magnetic bubble splitter means connected to magnetic bubble delay means connected to magnetic bubble switch means.

29. The apparatus of claim 28 in which said magnetic bubble splitter includes an input path and a pair of output paths and current energized means for splitting magnetic bubbles entering on said input path to produce a pair of bubbles each exiting on a different one of said output paths when said current energized means is energized.

30. The apparatus of claim 28 in which said magnetic bubble switch means has two output paths and directs said stream to a one output path if said stream is preceeded by a predetermined combination of magnetic bubbles and voids and otherwise directs said stream to a second output path.

31. The apparatus of claim 30 in which said magnetic bubble switch means includes loadable switches, magnetic bubble traps and current energized means for transferring magnetic bubbles preceeding said stream into said loadable switches and traps and for clearing said loadable switches.

* * * * *

UNITED STATES PATENT OFFICE
CERTIFICATE OF CORRECTION

Patent No. 4,003,037              Dated January 11, 1977

Inventor(s)   Hsu Chang

It is certified that error appears in the above-identified patent and that said Letters Patent are hereby corrected as shown below:

In column 2, line 43, change "keys" to --key--.

In column 3, line 63, correct the spelling of "apparatus"

In column 4, line 37, correct spelling of "whereas"

In column 6, line 63, correct spelling of "ahead"; in line 65, correct the spelling of "compressor".

In column 10, line 11, change "legal" to --"legal"-- and in the same line, change "illegal" to --"illegal"--.

In column 12, line 17 (claim 12, line 6), change "or" to --for--.

Signed and Sealed this

Twenty-seventh Day of December 1977

[SEAL]

Attest:

RUTH C. MASON
Attesting Officer

LUTRELLE F. PARKER
Acting Commissioner of Patents and Trademarks